United States Patent
Kuo et al.

(10) Patent No.: US 8,754,569 B2
(45) Date of Patent: Jun. 17, 2014

(54) THERMO-MAGNETIC POWER GENERATION SYSTEM

(75) Inventors: Chung-Jung Kuo, Taoyuan Hsien (TW);
Tze-Chern Mao, Taoyuan Hsien (TW);
Chieh-Cheng Liu, Taoyuan Hsien (TW);
Ming-Tsz Lin, Taoyuan Hsien (TW);
Ming-Han Lin, Taoyuan Hsien (TW);
Jiun-Lin Wu, Taoyuan Hsien (TW);
Jing-Mei Chou, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 128 days.

(21) Appl. No.: 13/432,588

(22) Filed: Mar. 28, 2012

(65) Prior Publication Data
US 2013/0258593 A1    Oct. 3, 2013

(51) Int. Cl.
*H02N 10/00* (2006.01)
*F01K 25/02* (2006.01)

(52) U.S. Cl.
USPC .................................. 310/306; 60/650

(58) Field of Classification Search
USPC ..................... 60/650, 682; 310/306; 62/3.1
See application file for complete search history.

(56) References Cited

U.S. PATENT DOCUMENTS

| | | | | |
|---|---|---|---|---|
| 380,100 | A * | 3/1888 | Edison | 310/307 |
| 1,431,545 | A * | 10/1922 | Schwartz | 310/306 |
| 1,756,800 | A * | 4/1930 | Schwartz | 310/306 |
| 2,016,100 | A * | 10/1935 | Schwarzkopf | 310/306 |
| 3,743,866 | A * | 7/1973 | Pirc | 310/306 |
| 4,447,736 | A * | 5/1984 | Katayama | 290/1 R |
| 4,625,519 | A * | 12/1986 | Hakuraku et al. | 62/3.1 |
| 4,727,722 | A * | 3/1988 | Kirol | 62/3.1 |
| 8,453,466 | B2 * | 6/2013 | Chang et al. | 62/3.1 |
| 2005/0120720 | A1 * | 6/2005 | Fang et al. | 62/3.1 |
| 2009/0217675 | A1 * | 9/2009 | Kobayashi et al. | 62/3.1 |
| 2010/0146989 | A1 * | 6/2010 | Egolf et al. | 62/3.1 |
| 2010/0263380 | A1 * | 10/2010 | Biederman et al. | 60/651 |
| 2011/0062821 | A1 * | 3/2011 | Chang et al. | 310/306 |
| 2011/0162388 | A1 * | 7/2011 | Barve et al. | 62/3.1 |
| 2011/0192836 | A1 * | 8/2011 | Muller et al. | 219/632 |
| 2012/0031107 | A1 * | 2/2012 | Heitzler et al. | 62/3.1 |

FOREIGN PATENT DOCUMENTS

EP    2108904 A1 * 10/2009 ............. F25B 21/00

* cited by examiner

*Primary Examiner* — Thomas Denion
*Assistant Examiner* — Mickey France
(74) *Attorney, Agent, or Firm* — Muncy, Geissler, Olds & Lowe, P.C.

(57) ABSTRACT

A thermo-magnetic power generation system includes a thermo-magnetic power generation device, a first circulating device, and a second circulating device. The first circulating device and the second circulating device are connected to the thermo-magnetic power generation device. The liquid is heated by the first circulating device and cooled by the second circulating device. The heated liquid and the cooled liquid transmitted to the thermo-magnetic element are recycled by the first circulating device and the second circulating device.

19 Claims, 3 Drawing Sheets

THERMO-MAGNETIC POWER GENERATION SYSTEM

BACKGROUND OF THE INVENTION

1. Field of the Invention

The invention relates to a power generation system, and in particular, to a thermo-magnetic power generation system.

2. Description of the Related Art

A thermo-magnetic power generator is considered a highly efficient and environmentally friendly generating technology. Thermo-magnetic power technologies adapt a magnetocaloric effect (MCE) of magnetocaloric materials (MCM) to generate an intermittent magnetic field.

In general, a magnetocaloric material has a Curie temperature ($T_c$). When the magnetocaloric material is heated and thus its temperature is raised above the Curie temperature, the magnetocaloric material generates a magnetic field. On the other hand, when the magnetocaloric material is cooled and thus its temperature is lowered beneath the Curie temperature, the magnetocaloric material generates a weak magnetic field or does not generate any magnetic field. Thus, by changing the temperature of the magnetocaloric material, the magnetocaloric material generates an intermittent magnetic field variation. Further, when the magnetocaloric material is rotatably disposed on a permanent magnet, a torque can be generated due to the intermittent magnetic field variation, and the torque could be utilized to generate power.

For a conventional thermo-magnetic power generator, a magnetocaloric material is heated by hot water. However, after the hot water flows through the magnetocaloric material, the hot water will be wasted and will not be utilized by the thermo-magnetic power generator again. Thus, the total energy conversion efficiency of the conventional thermo-magnetic power generator is low. Moreover, since the magnetocaloric material is slowly cooled by the environmental media with a small temperature difference, the frequency of magnetocaloric material passing through the thermo-magnetic power generator is limited, and the power generated by the thermo-magnetic power generator is low accordingly.

BRIEF SUMMARY OF THE INVENTION

To solve the problems of the prior art, an object of the invention is to provide a thermo-magnetic power generation system including a thermo-magnetic power generation device, a first circulating device, and a second circulating device. A liquid is circulated within the thermo-magnetic power generation device, the first circulating device, and the second circulating device.

For the above objective, the invention discloses a thermo-magnetic power generation system including a thermo-magnetic power generation device, a first pipe, a first circulating device, a second pipe and a second circulating device. The thermo-magnetic power generation device includes a thermo-magnetic element and a magnet unit. The thermo-magnetic element defines a first hot end, a second hot end, a first cold end, and a second cold end. The magnet unit provides a magnetic field to the thermo-magnetic element. The first pipe is coupled to the first hot end and the second hot end. The first circulating device is connected to the thermo-magnetic power generation device through the first pipe. The first circulating device is for transmitting a liquid into the thermo-magnetic element from the first hot end, and is for receiving the liquid from the second hot end. The second pipe is coupled to the first cold end and the second cold end. The second circulating device is connected to the thermo-magnetic power generation device through the second pipe. The second circulating device is for receiving the liquid from the first cold end of the thermo-magnetic element, and for transmitting the liquid into the thermo-magnetic element from the second cold end. The liquid received from the first cold end is cooled, wherein the liquid received from the second hot end is heated.

For the above objective, a thermo-magnetic power generation system includes a thermo-magnetic power generation device, a first circulating device, and a second circulating device. The thermo-magnetic power generation device includes a thermo-magnetic element and a magnet unit. The thermo-magnetic element defines a first hot end, a first cold end, and a plurality of thermo-magnetic portions arranged in a row and between the first hot end and the first cold end. The magnet unit provides a magnetic field to the thermo-magnetic portions. The first circulating device comprises a first main pipe and a plurality of first branch pipes. The first main pipe is coupled to the first hot end for transmitting a liquid into the thermo-magnetic portions from the first hot end. The first branch pipes are coupled to the first main pipe at one end and respectively to the thermo-magnetic portions at another end. The first branch pipes are for receiving the liquid exhausted from the thermo-magnetic portions. Moreover, the liquid received from the first main pipe is heated. The second circulating device includes a second main pipe, a storage tank, and a plurality of second branch pipes. The second main pipe is coupled to the first cold end for receiving the liquid from the first cold end. The storage tank is coupled to the second main pipe for storing the liquid. The second branch pipes are coupled to the storage tank at one ends and respectively to the thermo-magnetic portions at another ends for respectively transmitting the liquid from the storage tank to the thermo-magnetic portions. Moreover, the liquid received from the second branch pipes is cooled, In conclusion, the liquid is heated by the first circulating device and cooled by the second circulating device. The heated liquid and the cooled liquid transmitted to the thermo-magnetic element are recycled by the first circulating device and the second circulating device. Therefore, the energy efficiency of the thermo-magnetic power generation system is increased. Moreover, since the heated liquid and the cooled liquid flows through the thermo-magnetic element alternately, the rate of the thermo-magnetic element passing through the magnet unit can be increased, and the power generated by the thermo-magnetic power generation device can be increased.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
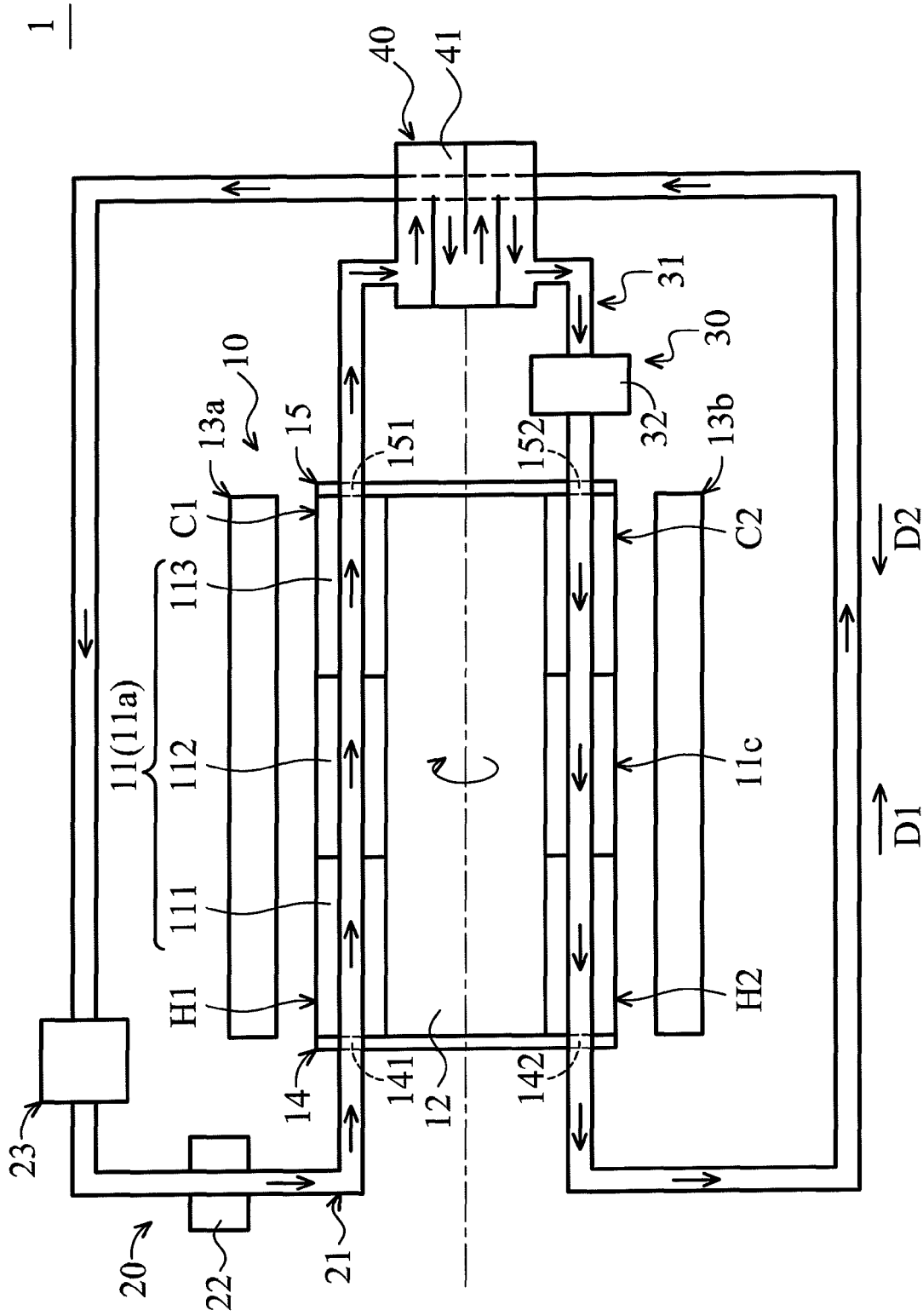
FIG. 1 is a schematic view of a thermo-magnetic power generation system of a first embodiment of the invention.
Figure 2:
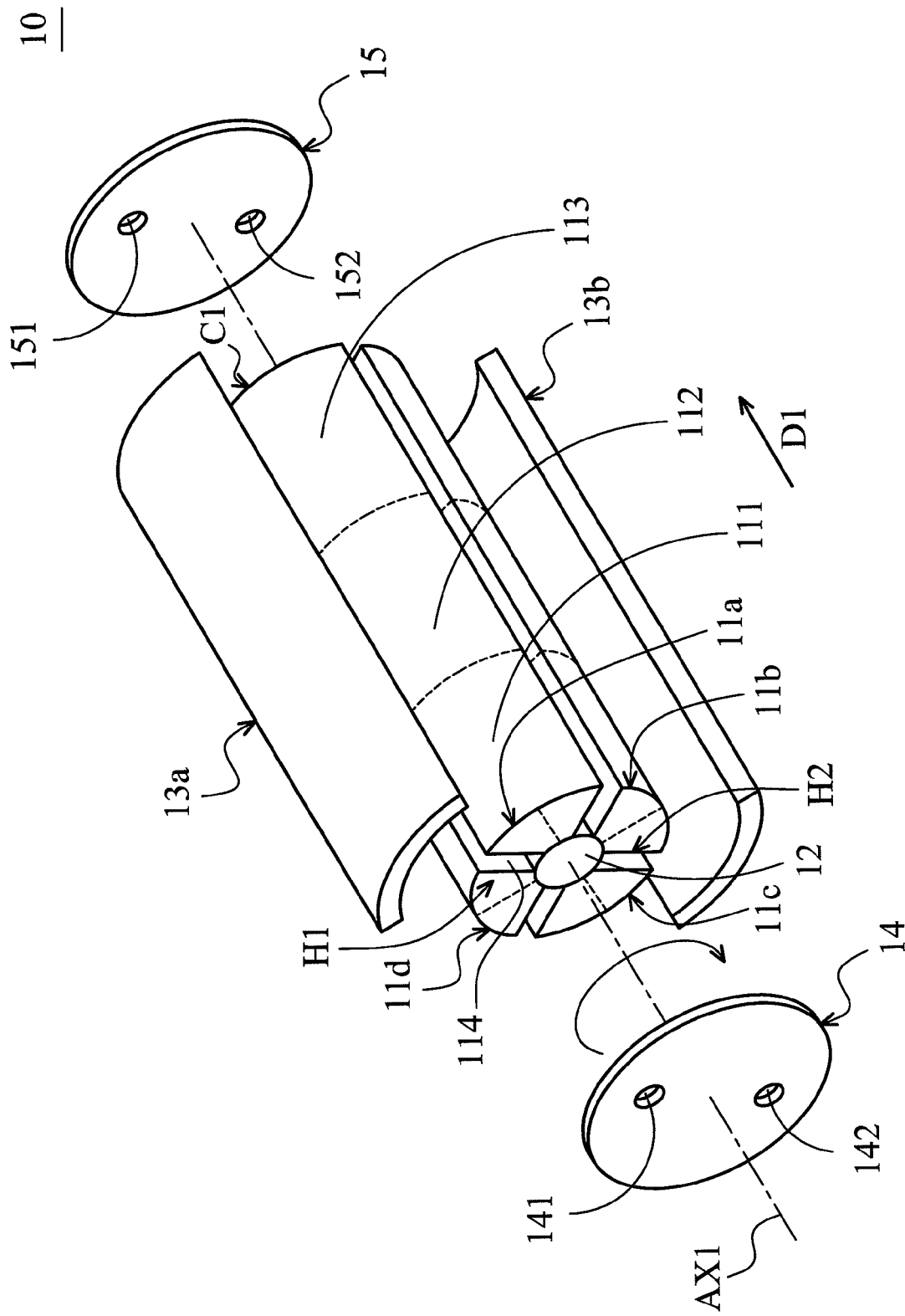
FIG. 2 is a schematic view of a thermo-magnetic power generation device of the first embodiment of the invention.

Please refer to FIGS. 1 and 2. FIG. 1 is a schematic view of a thermo-magnetic power generation system 1 of a first embodiment of the invention. FIG. 2 is a schematic view of a thermo-magnetic power generation device 10 of the first embodiment of the invention. Thermo-magnetic power generation system 1 includes a thermo-magnetic power generation device 10, a first circulating device 20, a second circulating device 30, and a cooling channel device 40. A liquid is circulated within the thermo-magnetic power generation device 10, the first circulating device 20, and the second circulating device 30. The liquid may be water.

The thermo-magnetic power generation device 10 includes a thermo-magnetic element 11, a shaft unit 12, two magnet units 13a and 13b, a first blocking unit 14, and a second blocking unit 15. The thermo-magnetic element 11 is made of magnetocaloric materials. The thermo-magnetic element 11 includes thermo-magnetic portions 111, 112, and 113. The thermo-magnetic portions 111, 112, and 113 are arranged in a row and in sequence along a first direction D1 from the first hot end H1 to the first cold end C1 and between the first hot end H1 and the first cold end C1. Curie temperatures of the thermo-magnetic portions 111, 112 and 113 are different. In the embodiment, Curie temperatures of the thermo-magnetic portions 111, 112, and 113 are gradually decreased along the first direction D1. The thermo-magnetic element 11 defines a thermo-magnetic area 11a, 11b, 11c and 11d. Each of the thermo-magnetic areas 11a, 11b, 11c and 11d has a guide channel 114 passing through the thermo-magnetic portions 111, 112, and 113. The thermo-magnetic element 11, thermo-magnetic areas 11a, 11b, 11c and 11d, and the guide channels 114 are extended along a first direction D1.

The shaft unit 12 is a cylindrical structure extended along the first direction D1. The thermo-magnetic element 11 is disposed around the shaft unit 12. The shaft unit 12 and thermo-magnetic element 11 are rotated about a rotating axis AX1. The rotating axis AX1 is parallel to the first direction D1. In other embodiments, the thermo-magnetic element 11 and the shaft unit 12 are formed as a single piece.

The magnet units 13a and 13b are permanent magnets, superconducting magnets, solenoids, or the combination thereof. The magnet units 13a and 13b are extended along the first direction D1 and disposed on two opposite sides of the thermo-magnetic element 11. The magnet units 13a and 13b provide a magnetic field to the thermo-magnetic portions 111, 112, and 113 of the thermo-magnetic element 11.

The first blocking unit 14 and the second blocking unit 15 are located at two opposite ends of the thermo-magnetic element 11 and the shaft unit 12. The first blocking unit 14 has a first inlet 141 and a first outlet 142. The second blocking unit 15 has a second outlet 151 and a second inlet 152. Since the thermo-magnetic element 11 and the shaft unit 12 are rotated corresponding to the first blocking unit 14 and the second blocking unit 15, one of the guide channels 114, which is close to the magnet unit 13a, is communicated with the first inlet 141 and the second outlet 151, and one of the guide channels 114, which is close to the magnet unit 13b, is communicated with the second outlet 142 and the second inlet 152. Moreover, when the guide channels 114 are not communicated with the first inlet 141 and the first outlet 151, or the second outlet 142 and the second inlet 152, the liquid is blocked by the sidewalls of thermo-magnetic element 11.

As shown in FIGS. 1 and 2, the thermo-magnetic element 11 defines a first hot end H1 and a first cold end C1 on two opposite ends of the thermo-magnetic area 11a, 11b, 11c or 11d, which is close to the magnet unit 13a, and defines a second hot end H2 and a second cold end C2 on two opposite ends of the thermo-magnetic area 11a, 11b, 11c or 11d, which is close to the magnet unit 13b. The thermo-magnetic portions 111a, 112a and 113a are located between the first hot end H1 and the first cold end C1 and between the second hot end H2 and the second cold end C2.

The first circulating device 20 is connected to the thermo-magnetic power generation device 10. The first circulating device 20 is for transmitting a liquid into the thermo-magnetic element 11 from the first hot end H1, and for receiving the liquid from the second hot end H2. Moreover, the first circulating device 20 receives cooled liquid exhausted from the thermo-magnetic power generation device 10, heats the cooled liquid, and then transmits the heated liquid to the thermo-magnetic element 11.

The first circulating device 20 includes a first pipe 21, a pump 22, and a heating element 23. One end of the first pipe 21 is communicated with the first inlet 141 and the other end of the first pipe 21 is communicated with the first outlet 142. In addition, one end of the first pipe 21 is coupled to the first hot end H1, and the other end of the first pipe 21 is coupled to the second hot end H2. The pump 22 is disposed on the first pipe 21 for increasing the flowing pressure of the liquid within the first circulating device 20. The heating element 23 is disposed on the first pipe 21 for heating the liquid within the first circulating device 20. The heated liquid flows from the first outlet 142 to the first inlet 141 along the first pipe 21.

The second circulating device 30 is connected to the thermo-magnetic power generation device 10. The second circulating device 30 is for receiving the liquid from the first cold end C1 of the thermo-magnetic element 11, and for transmitting the liquid into the thermo-magnetic element 11 from the second cold end C2. Moreover, the second circulating device 30 receives the heated liquid exhausted from the thermo-magnetic power generation device 10, cools the heated liquid, and then the cooled liquid flows into to the thermo-magnetic element 11 from the second circulating device 30.

The second circulating device 30 includes a second pipe 31 and a cooling element 32. One end of the second pipe 31 is communicated with the second inlet 151 and the other end of the second pipe 31 is communicated with the second outlet 152. In addition, one end of the second pipe 31 is coupled to the first cold end C1, and the other end of the second pipe 31 is coupled to the second cold end C2. The liquid flows along the second pipe 31 to the thermo-magnetic element 11. The cooling element 32 is disposed on the second pipe 31 for cooling the liquid within the second circulating device 30. The cooled liquid flows from the second inlet 151 to the second outlet 152 along the second pipe 31.

The first pipe 21 and the second pipe 31 are disposed on the cooling channel device 40. The cooling channel device 40 includes a bended cooling channel 41 communicated with the second pipe 31.

In the embodiment, when the thermo-magnetic element 11a is rotated to be close to the magnet unit 13a, the guide channel 114 of the thermo-magnetic element 11a is communicated with the first inlet 141 and the first outlet 151, and the heated liquid flows through the guide channel 114 of the thermo-magnetic portions 111, 112 and 113 of the thermo-magnetic element 11 along the first direction D1 from the first hot end H1 to the first cold end C1. When the thermo-magnetic element 11a is rotated to be close to the magnet unit 13b, the guide channel 114 of the thermo-magnetic element 11a is communicated with the second outlet 142 and the second inlet 152, and the liquid flows through the guide channel 114 of the thermo-magnetic portions 111, 112 and 113 of the thermo-magnetic element 11 along a second direction D2 from the second cold end C2 to the second hot end H2. Thus, the heated liquid and the cooled liquid flows through the guide channel 114 of the thermo-magnetic element 11a alternately in the thermo-magnetic power generation device 10. The first direction D1 is opposite to the second direction D2.

Further, when the heated liquid from the first circulating device 20 flows through the guide channel 114, the thermo-magnetic portions 111, 112 and 113 are heated by the heated liquid, and the temperatures of the thermo-magnetic portions 111, 112 and 113 will exceed the Curie temperatures thereof. Thus, the thermo-magnetic portions 111, 112, and 113 generate a stronger magnetic field. A repulsion magnetic force is generated between the thermo-magnetic element 11a and the magnet unit 13b, and an attractive magnetic force is generated between the thermo-magnetic element 11a and the magnet unit 13a. Thus, the shaft unit 12 and the thermo-magnetic element 11 can rotate about the axis AX1 because of the repulsion magnetic and the attractive magnetic force.

Next, when the cooled liquid from the second circulating device 30 flows through the guide channel 114, the thermo-magnetic portions 111, 112 and 113 are cooled by the cooled liquid, and the temperatures of the thermo-magnetic portions 111, 112 and 113 will be lower than Curie temperatures of the thermo-magnetic portions 111, 112, and 113. Thus, the magnetic field generated by the thermo-magnetic portions 111, 112 and 113 is weak. Thus, an attractive magnetic force between the thermo-magnetic portions 111, 112 and 113 and the magnet unit 13a is weak, the thermo-magnetic element 11 can easily leave the magnet unit 13a.

In the embodiment, for example, the Curie temperature of the thermo-magnetic portion 111 is 38° C., the Curie temperature of the thermo-magnetic portion 112 is 33° C., and the Curie temperature of the thermo-magnetic portion 113 is 28° C. Because of thermal equilibrium between the thermo-magnetic portions 111, 112 and 113 and the liquid, the temperature of the heated liquid within the thermo-magnetic element 11a is gradually decreased. Thus, the temperature of the liquid in the first inlet 141 is higher than the temperature of the liquid in the second outlet 151. For example, the temperature of the liquid in the first inlet 141 is 45° C., and the temperature of the liquid in the second outlet 151 is 30° C. Since the temperature of the liquid in the second outlet 151 approaches the Curie temperature of the thermo-magnetic portion 113, the cooling element 32 utilizes little energy to cool the liquid, and the temperature of the liquid can be lower than the Curie temperature of the thermo-magnetic portion 113.

Equally, because of thermal equilibrium between the thermo-magnetic portions 111, 112 and 113 and the liquid, the temperature of the liquid in the second inlet 152 is lower than the temperature of the liquid in the second outlet 142. For example, the temperature of the liquid in the second inlet 152 is 20° C., and the temperature of the liquid in the first outlet 142 is 28° C. Since the temperature of the liquid in the first outlet 142 approaches the Curie temperature of the thermo-magnetic portion 111, the heating element 23 utilizes little energy to heat the liquid, and the temperature of the liquid can exceed the Curie temperature of the thermo-magnetic portion 111. Therefore, high-energy efficiency of the thermo-magnetic power generation device 10 is achieved.

Moreover, since the thermo-magnetic element 11 is cooled by the cooled liquid, the frequency of the thermo-magnetic element 11 passing through the magnet units 13a and 13b can be increased, and the power generated by the thermo-magnetic power generation device 10 can be increased.

In addition, the liquid is cooled in the bended cooling channel 41 by the temperature of the environment. The first pipe 21 contacts the cooling channel device 40 and the liquid in the first pipe 21 is heated by the cooling channel device 40. Since the liquid in the second pipe 31 can be cooled without additional energy, and the liquid in the first pipe 21 can be cooled without additional energy, the energy efficiency of the embodiment is increased.

Figure 3:
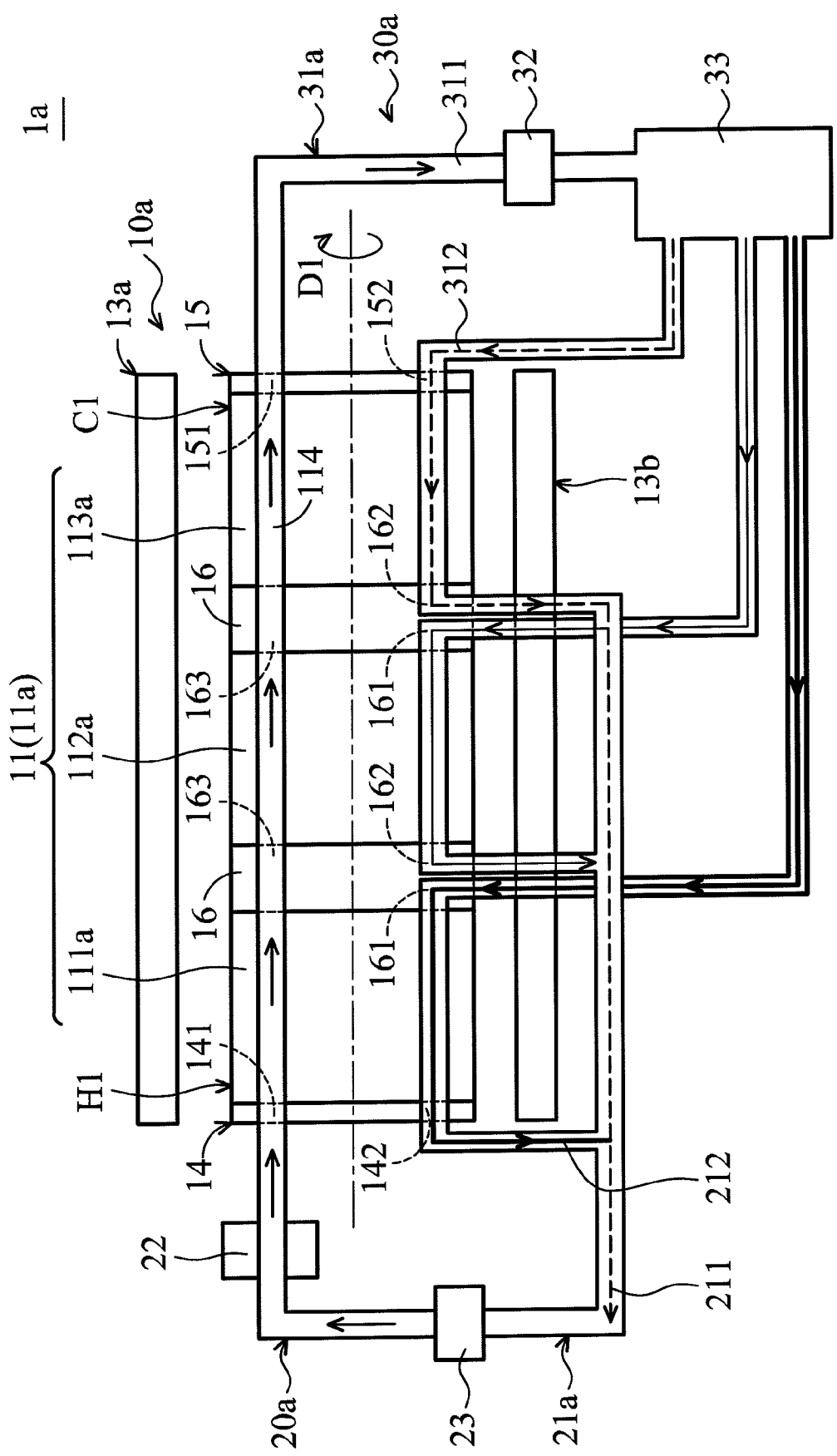
FIG. 3 is a schematic view of a thermo-magnetic power generation system of a second embodiment of the invention.

Please refer to FIG. 3, which is a schematic view of a thermo-magnetic power generation system 1a of a second embodiment of the invention. The difference between the first embodiment and the second embodiment is described as follows. The thermo-magnetic power generation device 10a further includes a plurality of third blocking units 16 disposed between two adjacent thermo-magnetic portions 111a, 112a, or 113a. Each of third blocking units 16 includes a third inlet 161, a third outlet 162, and a through hole 163. The through hole 163 is communicated with two adjacent guide channels 114.

A first pipe 21a of a first circulating device 20a further includes a first main pipe 211 and a plurality of first branch pipes 212. One end of the first branch pipes 212 is communicated with the first main pipe 211. The other end of the first branch pipes 212 is communicated with the first outlet 142 or the third outlet 162.

A second circulating device 30a further includes a second pipe 31a and a storage tank 33. The second pipe 31a further includes a second main pipe 311 and a plurality of second branch pipes 312. One end of the second main pipe 311 is communicated with the second outlet 151, and the other end of the second main pipe 311 is communicated with the storage tank 33. One end of the second branch pipes 312 are communicated with the storage tank 33, and the other ends of the second branch pipes 312 are communicated with the second inlet 152 or the third inlet 161.

The heated liquid flows through the thermo-magnetic portions 111a, 112a and 113a along a direction from the first hot end H1 to the first cold end C1, and the cooled liquid respectively flows through the thermo-magnetic portions 111a, 112a and 113a along a direction from the second main pipe 311 to the first main pipe 211

The temperature of the liquid transmitted to the thermo-magnetic portions 111a, 112a, and 113a are substantially equal to the temperature of the storage tank 33. Thus, the temperature of the liquid transmitted to the thermo-magnetic portions 111a and 112a is lower than the temperature of the liquid transmitted to the thermo-magnetic portions 111 and 112 of the first embodiment. The time for making the temperature of the thermo-magnetic portions 111a and 112a lower than the Curie temperatures thereof can be reduced.

In the embodiment, the liquid flows through the first main pipe 211, the thermo-magnetic element 11, the second main pipe 311, the storage tank 33, the second branch pipes 312, the thermo-magnetic element 11, and the first branch pipes 212 in sequence, and finally flows back to the first main pipe 211. The lengths of the first branch pipes 212 are different, and a longer first branch pipe has a greater cross sectional area. The lengths of the second branch pipes 312 are different, wherein a longer branch pipe 312 has a greater cross sectional area. Thus, the volume of the liquid transmitted to the thermo-magnetic portion 111, which is distant from the storage tank 33, is enough.

In conclusion, the liquid is heated by the first circulating device and cooled by the second circulating device. The heated liquid and the cooled liquid transmitted to the thermo-magnetic element are recycled by the first circulating device and the second circulating device. Therefore, the energy efficiency of the thermo-magnetic power generation system is increased. Moreover, since the heated liquid and the cooled liquid flows through the thermo-magnetic element alternately, the rate of the thermo-magnetic element passing through the magnet unit can be increased, and the power generated by the thermo-magnetic power generation device can be also increased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thermo-magnetic power generation system, comprising:
   a thermo-magnetic power generation device, comprising:
   a thermo-magnetic element, defining a first hot end, a second hot end, a first cold end, and a second cold end; and
   a magnet unit providing a magnetic field to the thermo-magnetic element;
   a first pipe, coupled to the first hot end and the second hot end;
   a first circulating device, connected to the thermo-magnetic power generation device through the first pipe, for transmitting a liquid into the thermo-magnetic element from the first hot end, and for receiving the liquid from the second hot end;
   a second pipe, coupled to the first cold end and the second cold end; and
   a second circulating device, connected to the thermo-magnetic power generation device through the second pipe, for receiving the liquid from the first cold end of the thermo-magnetic element, and for transmitting the liquid into the thermo-magnetic element from the second cold end,
   wherein the liquid received from the first cold end is cooled, and the cooled liquid flows through the thermo-magnetic element along a direction from the second cold end to the second hot end,
   wherein the liquid received from the second hot end is heated, and the heated liquid flows through the thermo-magnetic element along a direction from the first hot end to the first cold end.

2. The thermo-magnetic power generation system as claimed in claim 1, wherein the thermo-magnetic element is made of magnetocaloric material.

3. The thermo-magnetic power generation system as claimed in claim 1, wherein the thermo-magnetic power generation device comprises a shaft unit rotated about a rotating axis, and the thermo-magnetic element is disposed on the shaft unit.

4. The thermo-magnetic power generation system as claimed in claim 1, wherein the magnet unit is a permanent magnet, a superconducting magnet, a solenoid, or the combination thereof.

5. The thermo-magnetic power generation system as claimed in claim 1, wherein the first circulating device comprises a pump for increasing the flowing pressure of the liquid.

6. The thermo-magnetic power generation system as claimed in claim 1, wherein the first circulating device comprises a heating element for heating the liquid within the first pipe.

7. The thermo-magnetic power generation system as claimed in claim 1, wherein the second circulating device comprises a cooling element cooling the liquid within the second pipe.

8. The thermo-magnetic power generation system as claimed in claim 1, wherein the thermo-magnetic element has a guide channel, and the liquid flows through the guide channel.

9. The thermo-magnetic power generation system as claimed in claim 1, wherein the thermo-magnetic element comprises a plurality of thermo-magnetic portions arranged in sequence, and the Curie temperatures of the thermo-magnetic portions are gradually decreased along the direction from the first hot end to the first cold end.

10. A thermo-magnetic power generation system, comprising:
    a thermo-magnetic power generation device comprising:
    a thermo-magnetic element defining a first hot end, a first cold end, and a plurality of thermo-magnetic portions arranged in a row and between the first hot end and the first cold end; and
    a magnet unit providing a magnetic field to the thermo-magnetic portions;
    a first circulating device comprising:
    a first main pipe, coupled to the first hot end, for transmitting a liquid into the thermo-magnetic portions at the first hot end; and
    a plurality of first branch pipes, coupled to the first main pipe at one end and respectively to the thermo-magnetic portions at another end, for receiving the liquid exhausted from the thermo-magnetic portions;
    a second circulating device comprising:
    a second main pipe, coupled to the first cold end, for receiving the liquid from the first cold end;
    a storage tank, coupled to the second main pipe, for storing the liquid; and
    a plurality of second branch pipes, each coupled to the storage tank at one ends and respectively to the thermo-magnetic portions at another end, for respectively transmitting the liquid from the storage tank to the thermo-magnetic portions,
    wherein the liquid flowing from the first main pipe to the second main pipe is cooled, and the cooled liquid flows through the thermo-magnetic element along a direction from the second branch pipes to the first branch pipes,
    wherein the liquid flowing from the second branch pipes to the first branch pipes are heated, and the heated liquid flows through the thermo-magnetic element along a direction from the first main pipe to the second main pipe.

11. The thermo-magnetic power generation system as claimed in claim 10, wherein the thermo-magnetic element is made of magnetocaloric material.

12. The thermo-magnetic power generation system as claimed in claim 10, wherein the magnet unit is a permanent magnet, a superconducting magnet, a solenoid, or the combination thereof.

13. The thermo-magnetic power generation system as claimed in claim 10, wherein the first circulating device further comprises a pump, for increasing the flowing pressure of the liquid within the first main pipe.

14. The thermo-magnetic power generation system as claimed in claim 10, wherein the first circulating device further comprises a heating element, for heating the liquid within the first main pipe.

15. The thermo-magnetic power generation system as claimed in claim 10, wherein the second circulating device further comprises a cooling element, for cooling the liquid within the second main pipe.

16. The thermo-magnetic power generation system as claimed in claim 10, wherein each of the thermo-magnetic portions has a guide channel, and the liquid flows through the guide channels.

17. The thermo-magnetic power generation system as claimed in claim 10, wherein the thermo-magnetic portions are arranged along a direction from the first hot end to the first cold end, and the Curie temperatures of the thermo-magnetic portions are gradually decreased along the direction.

18. The thermo-magnetic power generation system as claimed in claim 10, wherein the lengths of the first branch pipes are different, and a longer first branch pipe has a greater cross sectional area.

19. The thermo-magnetic power generation system as claimed in claim 10, wherein the lengths of the second branch pipes are different, and a longer second branch pipe has a greater cross sectional area.

* * * * *